United States Patent
Harrand et al.

(10) Patent No.: US 7,193,918 B2
(45) Date of Patent: Mar. 20, 2007

(54) PROCESS FOR REFRESHING A DYNAMIC RANDOM ACCESS MEMORY AND CORRESPONDING DEVICE

(75) Inventors: Michel Harrand, Saint-Egreve (FR); Joseph Bulone, La Buissiere (FR)

(73) Assignee: STMicroelectronics S.A., Montrouge (FR)

( * ) Notice: Subject to any disclaimer, the term of this patent is extended or adjusted under 35 U.S.C. 154(b) by 83 days.

(21) Appl. No.: 10/766,291

(22) Filed: Jan. 26, 2004

(65) Prior Publication Data

US 2004/0218439 A1 Nov. 4, 2004

(30) Foreign Application Priority Data

Jan. 29, 2003 (FR) .................................. 03 01005

(51) Int. Cl.
*G11C 7/00* (2006.01)
*G11C 29/00* (2006.01)

(52) U.S. Cl. ................... 365/222; 365/201; 365/238.5

(58) Field of Classification Search ............... 365/222, 365/238.05, 201
See application file for complete search history.

(56) References Cited

U.S. PATENT DOCUMENTS

| | | | | |
|---|---|---|---|---|
| 4,736,344 A | * | 4/1988 | Yanagisawa | 365/222 |
| 5,329,490 A | * | 7/1994 | Murotani | 365/222 |
| 5,495,452 A | * | 2/1996 | Cha | 365/222 |
| 5,596,545 A | * | 1/1997 | Lin | 365/222 |
| 5,629,898 A | | 5/1997 | Idei et al. | |
| 5,654,930 A | * | 8/1997 | Yoo et al. | 365/222 |
| 6,084,812 A | * | 7/2000 | Joo | 365/222 |
| 6,141,280 A | * | 10/2000 | Cho | 365/222 |
| 6,199,139 B1 | | 3/2001 | Katayama et al. | |
| 6,229,747 B1 | | 5/2001 | Cho et al. | |
| 6,256,703 B1 | | 7/2001 | Feierbach | |
| 6,272,588 B1 | | 8/2001 | Johnston et al. | |
| 6,603,694 B1 | * | 8/2003 | Frankowsky et al. | 365/222 |
| 6,898,140 B2 | * | 5/2005 | Leung et al. | 365/222 |
| 2002/0080674 A1 | | 6/2002 | Dobler et al. | |
| 2002/0136075 A1 | | 9/2002 | Chen Hsu et al. | |

FOREIGN PATENT DOCUMENTS

| JP | 2002/324397 | 11/2002 |
|---|---|---|
| WO | WO 91/07756 | 5/1991 |

OTHER PUBLICATIONS

International Business Machines Corporation, "Method and apparatus for maximizing availability of an embedded dynamic memory cache", Research Disclosure, Kenneth Mason Publications, vol. 444, o. 143, Apr. 2001, XP007128041.
French Search Report, FR 03 01005, dated Oct. 7, 2003.

* cited by examiner

*Primary Examiner*—Trong Phan
(74) *Attorney, Agent, or Firm*—Jenkens & Gilchrist, PC

(57) ABSTRACT

The content of a few pages of the dynamic random access memory is backed up, then one tries to refresh them less quickly, for example two times less quickly, and one observes whether this does or does not cause errors. The operation is repeated on the entire memory. Depending on the number of errors that have appeared on the pages refreshed less often, the refresh period is decreased or increased. Thus, the memory self-adjusts its refresh period to what is necessary for it.

40 Claims, 4 Drawing Sheets

PROCESS FOR REFRESHING A DYNAMIC RANDOM ACCESS MEMORY AND CORRESPONDING DEVICE

PRIORITY CLAIM

The present application claims priority from French Application for Patent No. 03 01005 filed Jan. 29, 2003, the disclosure of which is hereby incorporated by reference.

BACKGROUND OF THE INVENTION

1. Technical Field of the Invention

The present invention relates to dynamic random access memories, that is to say those requiring periodic refreshing of the data contained in the memory cells of these memories. Also, the invention relates more particularly to the process of refreshing these dynamic random access memories.

The invention applies advantageously, but without limitation, to cellular mobile telephones which incorporate dynamic random access memories.

2. Description of Related Art

Third-generation cellular mobile telephones will require the integration of large quantities of memory. However, the cost of the product must remain low. The use of dynamic random access memories (DRAMs), in place of the static random access memories (SRAMs) as are currently used, allows for this rise in memory capacity to be achieved at a low cost.

However, an important constraint in this type of application is the low electrical consumption while the telephone is on standby, so as not to discharge the batteries too quickly. However, although dynamic random access memories have a smaller static leakage current than static random access memories, they need to be refreshed continuously if the data has to be preserved in standby mode. This refreshing requires energy consumption that it is important to minimize.

The refresh frequency is given by the number of memory pages to be refreshed and by the retention time of the memory. This retention time is essentially related to the junction leakages of the transistors of the memory cells. Now, these leakages vary essentially as a function of temperature.

At present, dynamic random access memories are refreshed at the frequency corresponding to the worst operating case, that is to say to the maximum temperature of the application.

The article by Jae-Yoon Sim et al., entitled "Double Boosting Pump, Hybrid Current Sense Amplifier, and Binary Weighted Temperature Sensor Adjustment Schemes for 1.8 V 128 Mb Mobile DRAMs," 2002 Symposium on VLSI Circuits Digest of Technical Papers, describes a temperature measurement system integrated onto the chip supporting the dynamic random access memory, and which acts on the refresh frequency. However, this system requires a tailoring of the temperature sensor at the on-board test level, this possibly complicating this test and therefore making it more expensive. Furthermore, a little current is consumed by the temperature sensor itself.

There is a need to optimize the refresh frequency of a dynamic random access memory, and to do so in a manner which is particularly simple to implement and without using an external sensor.

SUMMARY OF THE INVENTION

The present invention proposes a process for refreshing a dynamic random access memory in which the retention time of all the memory cells of the memory is measured continuously and dynamically, and the result of this measurement is used to regulate the refresh period of the memory.

Use of all the memory cells of the memory makes it possible to adjust the refresh period of the memory by using the actual retention time of the entire memory, and not by using statistical characterizations of the ratio of mean retention time of the cells to minimum retention time over the memory, and also without the use of any other external means, such as a temperature sensor.

According to one mode of implementation of the invention, the continuous and dynamic measurement of the retention time of all the cells comprises:

successive selections of different groups of cells of the memory, the so-called test cells, in such a way as to scan the entire set of cells of the memory, successive elementary measurements of the retention times of each group of selected test cells, and successive refreshings of the unselected cells.

Furthermore, the said successive elementary measurements are performed at a lower measurement frequency than the refresh frequency of the other cells of the memory, in such a way as to "refresh" the groups of test cells more slowly than the other cells of the memory.

When the memory is organized by pages, each group of test cells is preferably an integer number of pages, for example one page or several pages.

A particularly simple way of performing the phase of elementary measurement of the retention time of a group of selected test cells may comprise:

a writing to these selected test cells of a predetermined test content corresponding to the charging of all the capacitors of the test cells, and then a reading of the test cells and a metering of the number of errors in reading the content of the test cells having regard to the said test content.

Moreover, the measurement of the retention time of all the cells comprises for example an at least partial accumulation of the successive numbers of errors.

Finally, between the writing of the test content to the test cells and the reading of these test cells, at least two refreshings of the other cells of the memory are performed.

In general, the regulating of the refresh period is performed at the end of the test of the entire set of cells of the memory. However, it is also possible, and this is the reason why one speaks of at least partial accumulation, for the regulating of the refresh period to be able to be performed as soon as a certain number of errors has been detected, without waiting for the end of the test of the entire memory, in particular if one wishes to be able to react faster to a temperature variation.

When pages of the memory do not contain any useful data and are used as test pages, there is no reason to back up the content thereof. On the other hand, when memory pages do contain useful data and are in their turn selected as test cells, their content must be backed up.

This is why the elementary measurement phase furthermore comprises, for certain at least of the groups of selected test cells, a backup of the content of these test cells, and a restoring of the content of the test cells with the backed up content once the metering of the number of errors has been performed.

The backup can be performed in a predetermined part of the memory, for example in pages containing no useful data, or else if one does not wish to place any constraint on the use of certain pages of the memory, in an external backup memory. Of course, in this case, this external memory will have to contain at least as many pages as are tested in a retention time measurement cycle.

When two buffer memories connected to the dynamic memory are provided, the elementary measurement phase advantageously comprises a writing of the test content into a first buffer memory before writing to the test cells. Furthermore, the reading of the content of the test cells comprises a writing of the content of these test cells into the second buffer memory and then a reading of the second buffer memory.

This allows a further decrease in the consumption of current. Specifically, the periodic reloading of the test content is then done as a single operation of the buffer memory in the test page, instead of having to systematically rewrite all the words of the memory page.

Moreover, when just a single memory page is used as test page, it is advantageously possible to use one of the buffer memories as external backup memory.

Thus, according to one mode of implementation of the invention, the content of a few pages of the dynamic random access memory is backed up, then one tries to refresh them less quickly, for example two times less quickly, and one observes whether this does or does not cause errors. The operation is repeated on the entire memory. Depending on the number of errors that have appeared on the pages refreshed less often, the refresh period is decreased or increased. Thus, the memory self-adjusts its refresh period to what is necessary for it.

The number of test pages is for example chosen in such a way that the time required to test the retention of all the pages of the memory is sufficiently small as compared with the times of changes of temperature of the system. Thus, by way of indication, if one considers a memory comprising 4096 pages with minimum retention equal to 32 ms, and if one wishes to gain, at typical temperature, by a factor of 4 with regard to consumption due to refreshing at the minimum temperature, hence to have a maximum refresh period of 4×32 ms, and if one also assumes that the memory is refreshed twice as often as the test pages, then 256 ms (2×4×32) is necessary per set of test pages. So that the refresh period is evaluated every minute, it is consequently necessary to use around 16 test pages (4096/(60 s/256 ms)).

As far as the regulating of the refresh period is concerned, several solutions are possible.

According to a first possibility, the regulating of the refresh period of the memory may comprise
- a comparison of the number of accumulated errors with a low threshold and a high threshold,
- an increasing of the refresh period if the number of errors is less than the low threshold,
- a decreasing of the refresh period if the number of errors is greater than the high threshold, and
- a non-modification of the refresh period if the number of errors is greater than or equal to the low threshold and less than or equal to the high threshold.

Another solution, which is simpler, for the regulating of the refresh period of the memory can comprise comparing the number of accumulated errors with a single threshold, and in increasing the refresh period if the number of errors is less than or equal to the single threshold and in decreasing the refresh period if the number of errors is greater than or equal to the single threshold.

It is moreover preferable to make provision for a minimum limit value and, more particularly, a maximum limit value for the refresh period. Specifically, it is better to test the retention of the cells at a rate which remains fast compared with that of the movements in the temperature.

Although the process according to the invention can be applied at any moment, it is more particularly intended to be applied during a standby mode. Thus, when the memory is incorporated into an apparatus possessing a standby mode and an active mode of operation, such as for example a cellular mobile telephone, the mean retention time of the test cells is advantageously measured and the refresh period is regulated, at least in the course of the standby mode.

The invention also makes it possible in particular to reduce the refresh frequency, hence the consumption in standby mode, even at the maximum operating temperature.

The principle of such a mode of implementation is to tag the pages having the least retention, to note them, and to refresh them more often than the others. Specifically, generally, more than 90% of the pages of the memory may be refreshed two to four times less often than is necessary for the cells having a minimum retention.

Stated otherwise, the measurement of the retention time of all the cells of the memory being performed cyclically, there is provision, according to one mode of realization of the invention, that in the course of a measurement cycle, for example the first, the cells of the memory having a lower retention are tagged. Then, in the course of the next cycle or cycles, these so-called low cells are refreshed more often than the other cells of the memory.

The tagging of the "low" cells can also be performed regularly in the course of a current cycle of regulation of the memory refresh period.

The invention also proposes a dynamic random access memory device, comprising a dynamic random access memory and means for refreshing the memory.

According to a general characteristic of the invention, the device furthermore comprises auxiliary processing means able to continuously and dynamically measure the retention time of all the memory cells of the memory, and to use the result of this measurement to regulate the refresh period of the memory.

According to one embodiment of the invention, the auxiliary processing means comprise
- selection means able to perform successive selections of different groups of cells of the memory, the so called test cells, in such a way as to scan the entire set of cells of the memory, and
- measurement means able to perform successive elementary measurements of the retention times of each group of selected test cells.

Moreover, the refresh means are able to perform successive refreshings of the unselected cells, and the auxiliary processing means comprise control means able to activate the measurement means less often than the refresh means, in such a way as to "refresh" the groups of test cells more slowly than the other cells of the memory.

According to one embodiment of the invention, the measurement means comprise
- storage means able to store a predetermined test content corresponding to the charging of all the capacitors of the test cells,
- writing means able to write the test content into the selected test cells,
- reading means able to read the content of the test cells, metering means able to meter the number of errors in reading the content of the test cells having regard to the said test content, accumulation means able to perform an at least partial accumulation of the successive numbers of errors.

And between the writing of the test content to the test cells and the reading of these test cells, the control means are able to activate the refresh means at least twice.

According to one embodiment of the invention, the measurement means furthermore comprise backup means able to perform a backup of the content of the test cells, and restoration means able to perform a restoration of the content of the test cells with the backed up content once the metering of the number of errors has been performed. Also the control means are able to activate the backup and restoration means for certain at least of the groups of selected test cells.

According to one embodiment of the invention, the auxiliary processing means are able to cyclically perform the measurement of the retention time of all the cells of the memory. In the course of a measurement cycle, the auxiliary processing means are able to tag the cells of the memory having a lower retention, and in the course of the next cycle or cycles the refresh means are able to refresh these so-called low cells more often than the other cells of the memory.

The device according to the invention is advantageously embodied in the form of an integrated circuit.

The invention is also aimed at an apparatus possessing a standby mode and an active mode of operation, and incorporating a device as defined hereinabove, the auxiliary processing means being able to measure the retention time of all the cells of the memory and regulate the refresh period, at least in the course of the standby mode.

This apparatus may be a component of a wireless communication system, for example a cellular mobile telephone.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
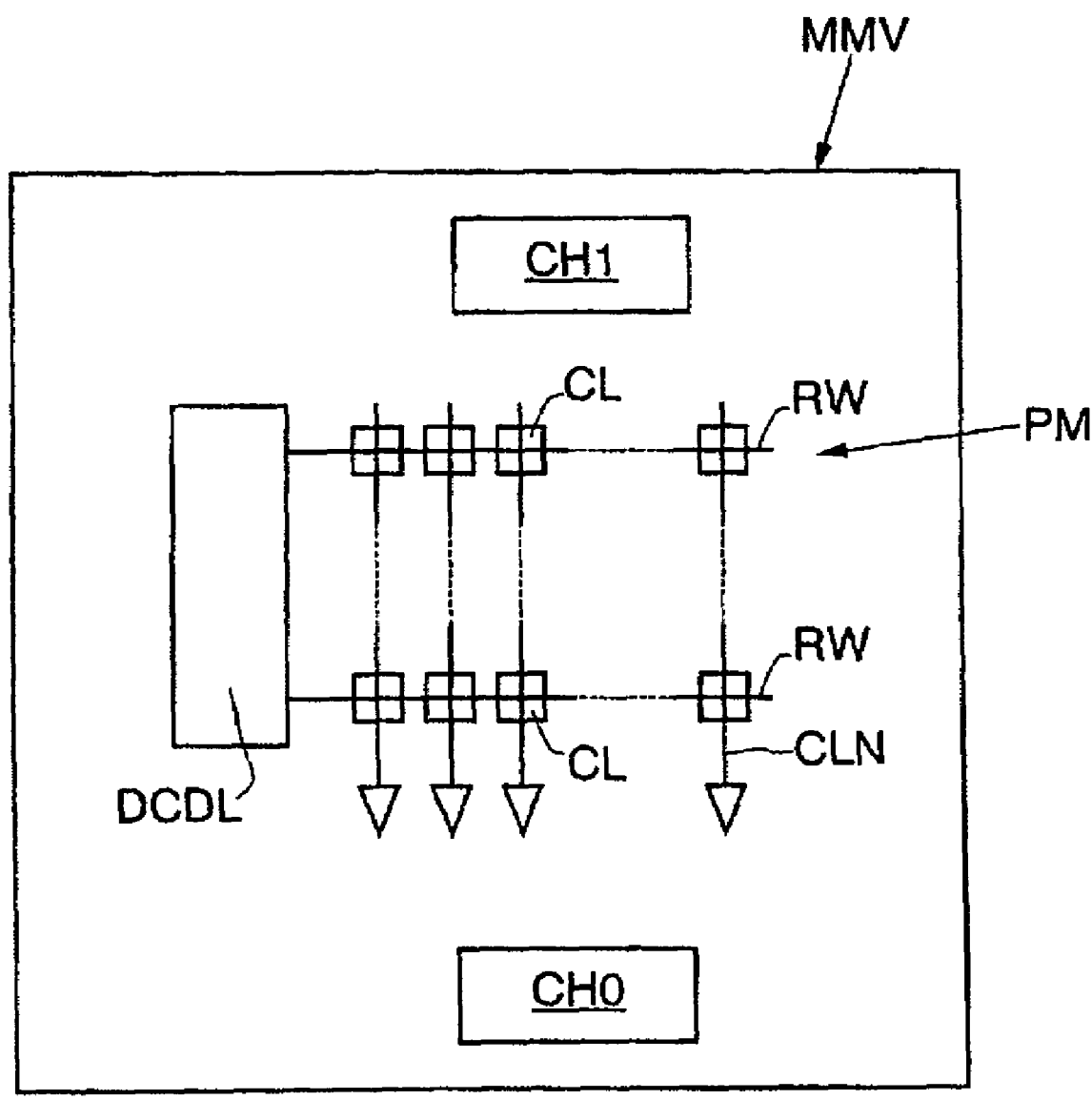
FIG. 1 diagrammatically illustrates a random access memory according to the invention within which the test cells are grouped together in rows.

In FIG. 1, the reference MMV designates a dynamic random access memory according to the invention whose memory plane PM comprises a matrix array of memory cells CL typically organized in rows RW and columns CLN. Each memory cell generally comprises a transistor and a capacitor. Additionally, in a conventional manner known per se, the memory plane is connected to a row decoder DCDL and to a column decoder (which are not represented here for simplifying purposes). Finally, in the example described here, the memory MMV comprises two buffer memories CH0 and CH1 connected to the memory plane PM.

The architecture of such a memory equipped with two buffer memories is, for example, described in European patent application No. 952 587 (which is incorporated by reference), and will make possible, as will be seen in greater detail hereinbelow, a preferred implementation of the invention.

In a general manner, according to the invention, the retention time of all the cells of the memory will be measured continuously and dynamically on the chip (integrated circuit) containing the memory MMV, and the refresh period of this memory will be adjusted accordingly.

In the example described herein, the memory is organized into memory pages, a page corresponding to a line of words.

Also, before returning in greater detail to the algorithm for adjusting the refresh period, we shall forthwith describe the basic outline of a mode of implementation thereof.

More precisely, the content of one or more pages of this memory, that are then dubbed test page(s), is backed up and then one tries to refresh them less quickly, for example two times less quickly than the remaining pages. One observes whether this does or does not cause errors. The operation is repeated on the entire memory, changing test page each time. Depending on the number of errors that have appeared on the pages refreshed less often, the refresh period is decreased or increased. Thus, the memory self-adjusts its refresh period to what is necessary for it.

In order to implement the mechanism for regulating the refresh frequency of the random access memory MMV, the memory device DMV according to the invention comprises (FIG. 2), in addition to the memory MMV, auxiliary processing means MAT whose structure and functionalities will now be described in greater detail. In a particular application of the invention, this device is incorporated into a cellular mobile telephone TP.

The auxiliary processing means MAT comprise storage means RGT here formed of a register, and containing a predetermined test content PT1 corresponding to the charging of all the capacitors of the current test cells. More precisely, this test content PT1 comprises logic values that are chosen in such a way that, when they are written to the memory cells, the corresponding capacitors of these memory cells are charged to the voltage that corresponds to the worst case of retention. In the present case this voltage is equal to the supply voltage. That said, in other types of memory, for example based on PMOS transistors, this voltage may be the ground. Additionally, the values of these test bits depend on the manner in which the memory is embodied (even column, odd column, etc).

The test content PT1 may be delivered on the input data bus DI of the memory by way of a multiplexer MUX1 controlled by a control signal. The other input of the multiplexer MUX1 receives the useful data to be written to the memory and emanating from a conventional controller CTLN dedicated to the normal mode of operation of the memory. This controller CTLN is moreover connected to the output data bus DO of the memory. Finally, it generates a refresh (RF) signal comprising the refresh commands as well as the memory control and address signals. Thus, all the cells of the memory are periodically refreshed, the period between two page refresh cycles being designated here by Tref.

Comparison means CMP1 receive on the one hand the content of the register RGT, that is to say the test content PT1 and, on the other hand, the content of the test cells, by way of the output bus DO. The comparison means CMP1 will compare, at predetermined instants, the content of the current test cells with the test content PT1. These comparison means CMP1 will, in combination with accumulation means ACC, make it possible to meter the number of errors in reading the current test cells, and also to accumulate the number of errors of the successive test pages during the complete scanning of the memory MMV. This number of errors NBE is stored in a register RG2.

The structure used in this embodiment to meter the number of errors NBE is compatible with a reading of a word line in blocks of bits. More precisely, for example, when a word line contains 1024 bits, the 1024 bits are read in blocks of 64 bits, this requiring 16 accesses to the memory.

Several modes of realization are then possible for performing the regulation of the refresh period by knowing the number NBE. One of these modes of realization is that illustrated in the remainder of FIG. 2 and that will now be described.

The number of errors NBE is compared ("<" and ">"), in comparison means CMP2, with a high threshold SH1 and with a low threshold SB1. The values of the high and low thresholds, SH1 and SB1, will be determined by the person skilled in the art as a function for example of the envisaged application and of the type of memory used.

The output of the comparison means CMP2 is linked to the input of decision logic MRG which acts as means for regulating the refresh period Tref. More precisely, in a general manner, if the number of errors NBE is less than ("<") the low threshold SB1, the refresh period Tref is increased. If this number of errors is greater than (">") the high threshold SH1, this period is decreased. If it is less than or equal to the high threshold and greater than or equal to the low threshold, the refresh period Tref is left unchanged.

Hardware-wise, this can be achieved by a multiplexer MUX2 controlled by the regulating signal SRG emanating from the means MRG. This multiplexer MUX2 possesses three inputs. The middle input is linked to the output of the register RGT2 which contains the value of the refresh period Tref. Another input of the multiplexer is linked to the output of an adder ("+"). Such an adder possesses a first input linked to the output of the register RGT2 and a second input, linked to a constant CH. The multiplexer MUX2 also possesses a third input linked to the output of a subtractor ("−"). This subtractor possesses a first input linked to the output of the register RGT2 and a second input linked to a constant CB. The output of the multiplexer MUX2 is linked to the input of the register RGT2.

Thus, if the refresh period should remain unchanged, it is the middle input of the multiplexer MUX2 which is selected. On the other hand, if the refresh period should be increased, it is the left input (in FIG. 2) which is chosen, the refresh period then being incremented by the constant CH. If the refresh period should be decreased, it is the right input of the multiplexer MUX2 which is selected, the refresh period then being decreased by the constant CB.

This said, two other registers are also provided, respectively comprising a lower limit value SB2 and a limit value SH2 for the refresh period Tref. Also, the regulating of the refresh period just described is applied while the refresh period lies between these two limit values SB2 and SH2. On the other hand, if the refresh period is less than ("<") the limit value SB2, the regulating of the refresh period can only take the form of an increase in the refresh period. Likewise, if the refresh period is greater than (">") the limit value SH2, then the regulating of the refresh period can only take the form of a decrease in the refresh period. In practice, on initialization, a refresh period corresponding to the maximum refresh frequency having regard to the worst temperature case will be chosen. This initial value of the period then corresponds to the minimum limit value SB2. By way of indication, for a temperature of 85° C., the worst case retention time corresponds to 32 ins.

As a variant, it is also possible to use a very simple refresh period modification decision algorithm using just a single threshold for the comparison of the number of errors NBE, for example a threshold equal to zero. More precisely, if there is no error in the entire memory, the value of the refresh period is increased (this new value having to be less than twice the previous value in the case where the test pages are "refreshed" two times less quickly than the remainder of the memory), otherwise it is decreased, with, as in the variant just described, a lower limit value SB2 and an upper limit value SH2.

Figure 2:
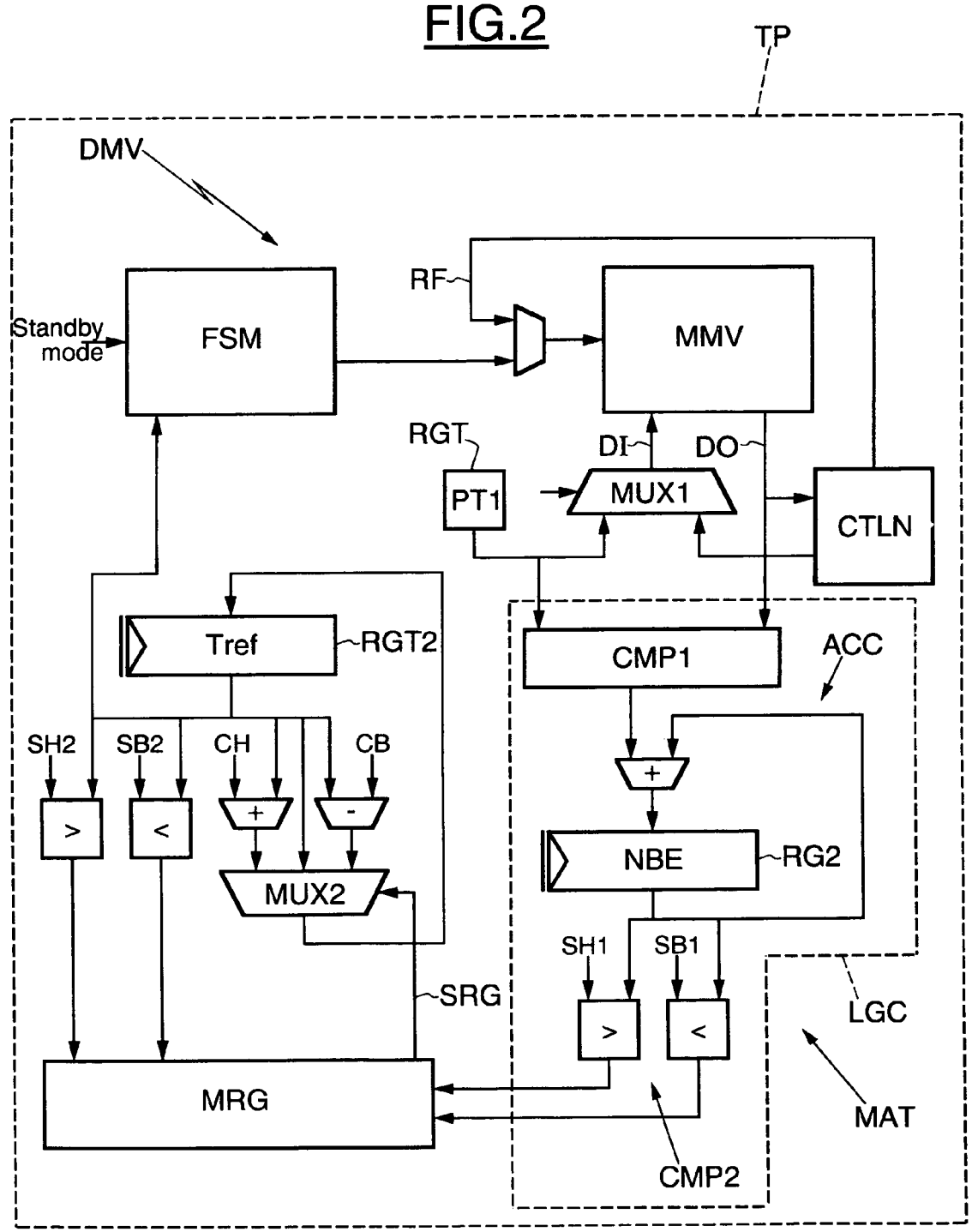
FIG. 2 illustrates in greater detail but still diagrammatically a memory device according to the invention and more particularly the auxiliary processing means associated with the random access memory according to the invention.

In this case, the logic for counting the number of errors NBE, rectangle LGC demarcated by dashes in FIG. 2, reduces to a simple logical OR gate in regard to the error bits, and to a single flip-flop, set to 1 if at least one error is detected, and reset to zero by the state machine FSM at each main cycle of the algorithm (that is to say when the test pages again become those used at the start of the cycle).

As just mentioned, in addition to the means just described, the auxiliary processing means MAT also comprise control means, in the form of a finite state machine FSM, and it is this machine FSM which will sequence the refreshing of the test cells and trigger the calculation of the number of errors NBE as well as the regulating of the refresh period Tref.

Figure 3:
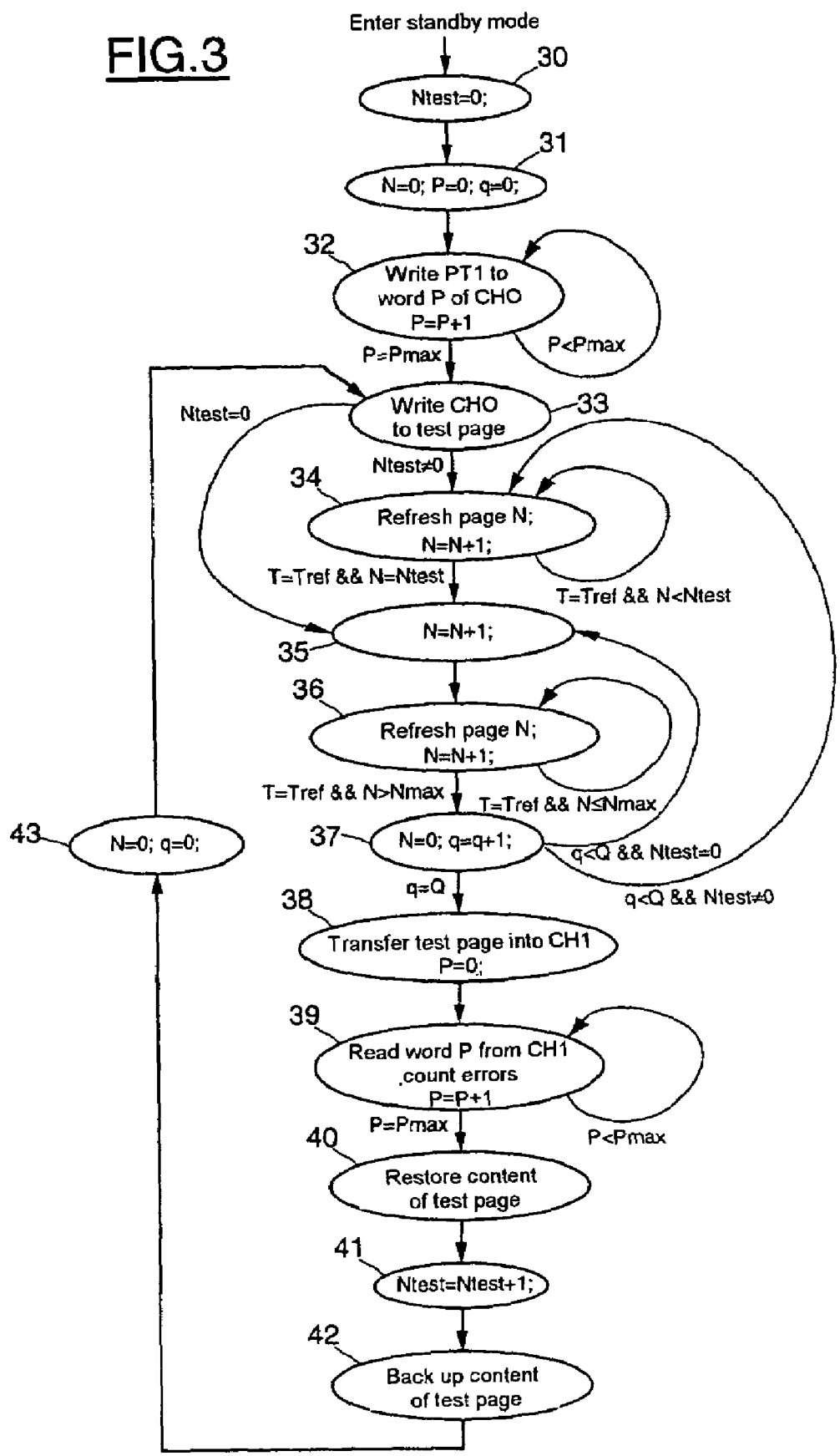
FIG. 3 represents a diagrammatic flowchart of a mode of implementation of the process according to the invention.

To describe the various states of this machine FSM, reference will now be made more particularly to FIG. 3. In this figure, and in this exemplary implementation, N designates the memory page address, P designates the address of a word in a page and Q designates the number of refresh cycles between the writing of the test content into a test page and the reading of the content of this test page with a view to the metering of the errors. Q is for example equal to 2. Moreover, the chart of FIG. 3 corresponds, for simplifying reasons, to the case where the number of test pages is equal to 1. Also, Ntest denotes the address of the current test page. Finally, T denotes the current time, counted as a number of cycles, since the last refresh.

It is also assumed, in this mode of implementation, that the first page of the memory contains no useful data. It will consequently be seen that it is in this first page that the content of the subsequent pages will be backed up before they are tested.

On entry to the standby mode, the first page of the memory is used as test page (Ntest equals zero; step 30). In this way, a first of a successive number of groups of cells in memory is selected for retention time testing. The variables N, P and q are also initialized to zero (step 31). As indicated hereinabove, the refresh period Tref is set to the minimum value, corresponding to the maximum temperature of use of the system. In step 32, PT1 is written to word P of the buffer memory CH0, and then P is incremented by 1 (P=P+1). A test is then made to see whether P<Pmax. If so, step 32 is repeated. When P is equal to Pmax, that is to say when all the test words have been written to the buffer memory CH0 (step 32), the content of the first buffer memory CH0 is transferred (step 33) into the test page of the memory MMV (i.e., write CH0 to test page). Thus predetermined test content has been written to the selected cells.

As Ntest is equal to zero (see, step 33 test Ntest≠0), we go directly to step 35, in which N is incremented by one unit (N=N+1) and then we proceed, in step 36, to the periodic refreshing of all the other pages of the random access memory. Thus, in step 36, page N is refreshed, and then N is incremented (N=N+1). A test is then made in step 36 as to whether T=Tref and N≦Nmax. If so, step 36 is repeated. This operation effectuates a successive refreshing of unselected cells in the memory. If, on the other hand, T=Tref and N>Nmax, the process moves on to step 37. Thereafter, N is reinitialized to zero (N=0) in step 37 and q is incremented (q=q+1).

Since q is less than Q (q<Q in step 37 test; here taken equal for example to be Q=2), we return to step 35 and proceed to a second of successive refreshings of the pages of the memory other than the test page. At least two refreshings of unselected cells occur between successive test content writing/reading operations. If, on the other hand, q<Q and Ntest=0, then the process returns to step 34. When q is equal to Q (q=Q) we then proceed on to step 38 and to the "refreshing" of the test cells of the test page. In fact, here the term "refreshing" is used improperly in respect of a test cell although it is not in reality a refreshing. More precisely, in step 38 the content of the test cells is read and stored in the second buffer memory CH1 ("transfer test page into CH1" and set "P=0") and then in step 39 the content of the buffer memory CH1 is read ("read word P from CH1" and increment P "P=P+1"). A test is made in step 39 as to whether P<Pmax. If so, step 39 is repeated. When P=Pmax, the process moves on to step 40.

We then proceed, within step 39, to the counting (or metering) of the reading errors ("count errors"), by comparing the content thus read with the test content PT1. This process of counting errors in effect performs a measurement on the selected group of cells as to retention, and thus permitted refresh rate. The counting of errors occurs less frequently than the refresh frequency for the non-selected cells. What in effect results is a measurement of a retention time of the selected cells. When errors occur and are counted, the retention time for those cells has been exceeded. Since successive numbers of groups are selected, then over time corresponding successive measurements of retention time are performed. The count represents an accumulation of the number of errors.

Thus, the person skilled in the art will have observed that the test cells are "refreshed" Q times less often than the other cells of the random access memory.

By using two buffer memories the consumption of current can be further decreased since the test content is loaded into one of the buffer memories, the other buffer memory being used for reading. Also, the periodic reloading of the test content PT1 is then done in a single so-called "write back" operation of the buffer memory into the page, instead of having to systematically rewrite all the words of the page.

Thereafter, one proceeds to a restoration of the content of the test page. In fact, this step 40 is not necessary in the present case for the first test page, but we shall see that it is necessary for the subsequent test pages.

Next, Ntest is incremented by one unit (step 41) 50 that the page having the address 1 in the memory becomes in its turn the test page. In this way, a next one of a successive number of groups of cells in memory is selected for retention time testing. One then proceeds to a backup (step 42) of the content of the new test page, for example here by transferring its content into the page with address zero. Such a backup can be made to a predetermined part of the memory or to an external backup memory. Next, after having reinitialized the variables N and q to zero (step 43), we return to step 33 in which the new test page is loaded with the test content PT1 ("write CH0 to test page").

For a test page having the address Ntest different from zero (Ntest≠0), steps 34, 35, 36 and 37 are performed in succession, during which we proceed to a refreshing of the pages of the memory other than the test page. In other words, a successive refreshing of the non-selected cells is performed. In step 34, page N is refreshed and N is incremented by 1 (N=N+1). A test is made in step 34 as to whether T=Tref and N<Ntest. If so, step 34 is repeated. When T=Tref and N=Ntest, the process moves on to step 35 (described above). Then, since Q is greater than or equal to 1, one or more refreshings of the memory are again performed (as a function of the number Q) with the exception of the test page. Next, on completion of these refreshes, and after, having performed the transfer 38 of the content of the test page into the buffer memory CH1, we again proceed to the counting of the errors related to the reading of this test page an hence measuring the retention time of the cells. Moreover, this new number of errors is accumulated with the previous number of errors corresponding to the previous test page.

Then, in step 40, we proceed to the restoration of the content of the test page, that is to say the initial content which was backed up in the present case in the memory page with address 0 will be written back to the memory page that has just been the test page.

It is then possible to change test page again and the cycle is repeated until all the pages of the memory have been used as test page. At that moment, as a function of the total number of accumulated errors, the refresh period is increased or decreased. This therefore marks the end of a main cycle of regulation of the refresh period. Then it is again the first page of the memory that becomes the test page and the operations described above are performed again in succession for all the pages of the memory so as to carry out a new cycle of regulation of the refresh period.

As a variant, the modification of the refresh period can also be done as soon as a certain number of errors has been detected, without waiting for the end of the test of the entire memory if one wants to be able to react faster to a temperature variation for example.

If one does not wish to place any constraint on the use of certain pages of the memory, it is possible to use a small external memory to temporarily back up the data of the tested pages. Of course, this memory must then contain as many pages as are tested in an operating cycle of the algorithm.

In the case where just a single test page is used, it is then particularly advantageous and particularly simple to use one of the buffer memories CH0 or CH1 for the temporary backing up of the data of the tested page.

Figure 4:
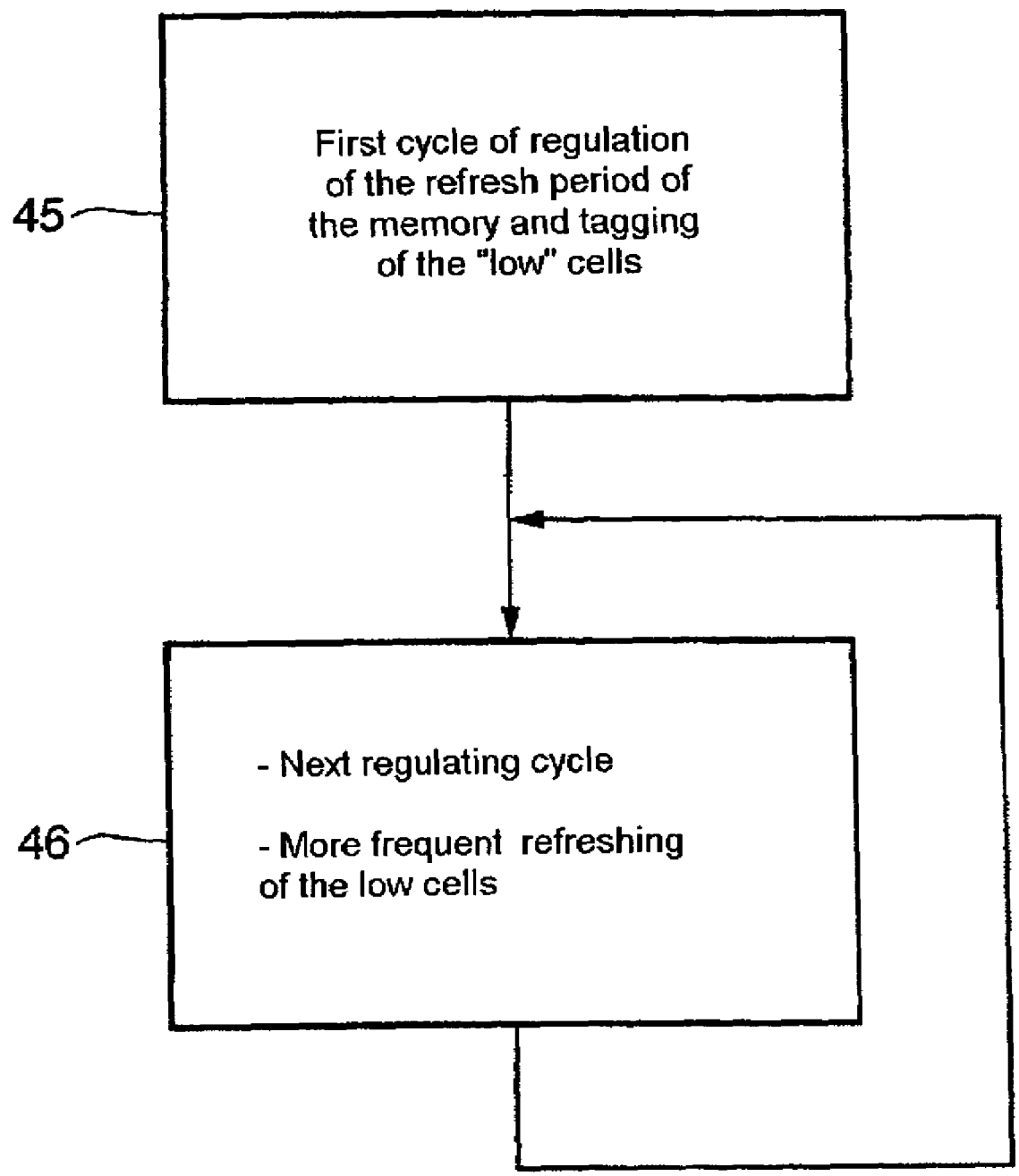
FIG. 4 illustrates another mode of implementation of the invention.

The variant of the invention illustrated diagrammatically in FIG. 4 makes it possible to reduce the refresh frequency and hence the consumption in standby mode, even at maximum operating temperature. The principle of this variant comprises tagging, in the course of the first cycle of regulation of the refresh period of the memory, the pages having the least retention, of labeling them as "low" (step 45) and, in the next regulating cycle, of subsequently refreshing them more often than the others (step 46). Specifically, generally, more than 90% of the pages of the memory can be refreshed 2 to 4 times less often than is necessary for the cells of minimum retention. Several modes of implementation of this variant are possible.

More precisely, as far as the sequencing is concerned, it is conceivable to refresh all the pages at the maximum frequency, and to skip the refreshing of the pages that are not labeled as "low" one time out of two. Or else, the system can work at the minimum frequency plus 10% and insert an additional refreshing of the "low" page with address n just before (or after) processing the page with address (N/2+n) modulo N, where N denotes the total number of pages in the memory.

As far as the storing of the so-called "low" page information is concerned, it is possible to use for example a static random access memory (SRAM memory) of N words. Each word then makes it possible to label whether or not the page is low and possibly the state of its refresh if the first sequencing solution mentioned hereinabove is opted for.

It is also possible to use an associative memory of P words with P equal to substantially 10% of N, this memory storing, for each page with address n labeled as "low," the value (N/2+n) modulo N. When the refresh address counter arrives at one of the addresses present in the associative memory, it then inserts a refresh of the page with address n.

The choice of these two modes of storage depends on the relevant number of "low" pages. If this number is low, the second solution just described is more economical.

As far as the decision algorithm is concerned, it is for example possible to refresh the memory at the frequency F and to test each page at the frequency F/2. When an error is detected, and if there are fewer than N "low" pages, the page for which an error is detected is labeled as "low" and will be refreshed at 2F and tested at F. If on the other hand there are already N low pages, this page is not labeled as low but the frequency F is increased. If, when all the pages have been tested, there have been no errors, F is decreased and the testing of the memory is begun again.

There is accordingly disclosed an apparatus and a process for refreshing a dynamic random access memory. The retention time of all the memory cells of the memory is continuously and dynamically measured. The refresh period Tref of the memory is continuously and dynamically regulated based on the result of those measurements. With respect to continuously and dynamically measuring the retention time of all the memory cells, different groups of cells (sub-sets) of the memory are successively selected (see, states 30 and 41) by FSM and DCDL in such a way as to scan the entire set of cells of the memory (using the incremented index Ntest). For each successively selected group of cells, MAT makes a retention time measurement by writing predetermined test content to the selected group of cells (using MUX1), reading the selected group of cells after a delay period (using DO), and metering the read test content for content errors (see, states 33–35 and 37–39) using LCG. The number of accumulated reading errors is measured by RG2. The delay period occurs while successive refreshes continue to be performed with respect to the unselected cells (see, state 36) by CTLN and RF. Thus, the successive measurement operation performs measurements on the selected group of cells at a lower measurement frequency than a refresh frequency of the unselected cells of the memory such that each selected group of cells is refreshed more slowly (i.e., with a longer refresh rate) than unselected cells of the memory (which are refreshed at, for example, the current refresh rate of the array). For example, using the index Q and q, refreshing the unselected cells of the memory occurs at least twice in between the writing of the test content to the selected group of cells and the reading of the selected group of cells (see, state 39). Prior to testing a selected group of cells, the content of the selected group of cells is backed up (see, state 42). Following completion of the metering of the number of content errors, the content of the selected group of cells is restored with the backed up content (see, state 40). First and second buffers CH0 and CH1 function to store the test content (see, state 32) and the read content of the selected group of cells (see, state 38).

With respect to continuously and dynamically regulating the refresh period, the comparator CMP2 compares the metered number of accumulated errors with a low threshold and a high threshold (SH1 and SB1). In the event the metered number of accumulated errors is less than the low threshold, the refresh period is increased (i.e., adjusted, such that the rate decreases) by MRG, MUX2, RGT2 and CH. If the metered number of accumulated errors is greater than the high threshold, the refresh period is decreased (i.e., adjusted, such that the rate increases) by MRG, MUX2, RGT2 and CH. In a third case, if the metered number of accumulated errors is greater than or equal to the low threshold and less than or equal to the high threshold then the refresh period is not modified by MRG, MUX2 and CH. Minimum and maximum values for the refresh period are set by SH2 and SB2.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for refreshing a dynamic random access memory, comprising:
continuously and dynamically measuring the retention time of all the memory cells of the memory, wherein continuously and dynamically measuring the retention time comprises performing retention time measurements for the cells of the memory cyclically, and tagging the cells of the memory having a lower retention time as measured in the course of a measurement cycle, and wherein regulating the refresh period of the memory comprises setting the refresh period in the course of a next measurement cycle of the tagged cells to be refreshed more often than non-tagged cells of the memory; and
regulating the refresh period of the memory based on the result of this measurement.

2. A process for refreshing a dynamic random access memory, comprising:
continuously and dynamically measuring the retention time of all the memory cells of the memory, wherein continuously and dynamically measuring the retention time of all the memory cells comprises:
successively selecting different groups of cells of the memory in such a way as to scan the entire set of cells of the memory;
successively measuring the retention times of each group of cells; and
successively refreshing the unselected cells;
wherein successively measuring comprises performing measurements on a selected group of cells at a lower measurement frequency than a refresh frequency of the unselected cells of the memory such that each selected group of cells is refreshed more slowly than unselected cells of the memory; and
regulating the refresh period of the memory based on the result of this measurement.

3. The process according to claim 2, wherein the memory is organized by pages, and each selected group of cells comprises an integer number of pages.

4. The process according to claim 2,
wherein selectively measuring comprises:
  writing predetermined test content to the selected group of cells;
  reading of the selected group of cells; and
  metering of a number of content errors in the reading of the selected group of cells in comparison to the predetermined test content;
wherein selectively measuring the retention time comprises measuring the retention time of all the memory cells by an at least partial accumulation of the metered number of content errors; and
wherein successively refreshing comprises refreshing the unselected cells of the memory at least twice in between the writing of the test content to the selected group of cells and the reading of the selected group of cells.

5. The process according to claim 4, wherein successively measuring further comprises, for at least one selected group of cells, backing up of the content of the selected group of cells, and restoring of the content of the selected group of cells with the backed up content following metering of the number of content errors.

6. The process according to claim 4,
wherein successive measuring comprises writing of the test content into a first buffer memory before writing to the selected group of cells; and
wherein reading of the test content from the selected group of cells comprises writing of the read content of the selected group of cells into a second buffer memory followed by reading of the second buffer memory.

7. The process according to claim 5, wherein backing up comprises storing in a predetermined part of the memory or else in an external backup memory.

8. The process according to claim 6, wherein each selected group of cells forms a single page of the memory, and backing up comprises storing in one of the first and second buffer memories.

9. The process according to claim 4, wherein regulating of the refresh period of the memory comprises:
  comparing the metered number of accumulated errors with a low threshold and a high threshold;
  increasing the refresh period if the metered number of accumulated errors is less than the low threshold;
  decreasing the refresh period if the metered number of accumulated errors is greater than the high threshold; and
  non-modifying the refresh period if the metered number of accumulated errors is greater than or equal to the low threshold and less than or equal to the high threshold.

10. The process according to claim 4, wherein regulating of the refresh period of the memory comprises:
  comparing the metered number of accumulated errors with a threshold;
  increasing the refresh period if the metered number of errors is less than the threshold; and
  decreasing the refresh period if the metered number of errors is greater than or equal to the threshold.

11. The process according to claim 10, wherein refresh period has a minimum limit value and a maximum limit value.

12. The process according to claim 1,
wherein the memory is incorporated into an apparatus which operates in both a standby mode and an active mode of operation, and wherein measuring and regulating are performed at least in the course of the standby mode.

13. The process according to claim 12, wherein the apparatus is a handset of a wireless communication system.

14. A dynamic random access memory device, comprising:
  a dynamic random access memory; and
  a memory refreshing circuit that operates to continuously and dynamically measure the retention time of all the memory cells of the memory, and to regulate the refresh period of the memory based on the result of this measurement;
wherein the memory refreshing circuit cyclically performs the measurement of the retention time of all the cells of the memory, and tags the cells of the memory having a lower retention as measured in the course of a measurement cycle, and regulates the refresh period of the memory by setting the refresh period in the course of a next measurement cycle of the tagged cells to be refreshed more often than non-tagged cells of the memory.

15. The device according to claim 14,
wherein the device is incorporated into an apparatus which operates in both a standby mode and an active mode of operation, and wherein the memory refreshing circuit operates to measure and regulate during at least the course of the standby mode.

16. The device according to claim 15, wherein the apparatus comprises a handset of a wireless communication system.

17. The device according to claim 16, wherein the handset is a cellular mobile telephone.

18. A dynamic random access memory device, comprising:
  a dynamic random access memory; and
  a memory refreshing circuit that operates to continuously and dynamically measure the retention time of all the memory cells of the memory, and to regulate the refresh period of the memory based on the result of this measurement, wherein the memory refresh circuit comprises:
    a selection circuit operating to perform successive selections of different groups of cells of the memory in such a way as to scan the entire set of cells of the memory;
    a measurement circuit operating to perform successive measurements of the retention times of each selected group of cells; and
    a refresh circuit operating to perform successively refresh the unselected cells;
  wherein the measurement circuit is activated to perform measurements on a selected group of cells at a lower measurement frequency than a refresh frequency of the unselected cells of the memory such that selected groups of cells are refreshed more slowly than unselected cells of the memory.

19. The device according to claim 18, wherein the memory is organized by pages, and each selected group of cells comprises an integer number of pages.

20. The device according to claim 18, wherein the measurement circuit comprises:
  a storage device to store predetermined test content;
  a write circuit to write the predetermined test content to the selected group of cells;
  a read circuit to read the selected group of cells;
  a metering circuit to meter the number of content errors in the reading of the selected group of cells in comparison to the predetermined test content; and an accumulation circuit to perform an at least partial accumulation of the metered number of content errors; and wherein the refresh circuit refreshes the unselected cells of the memory at least twice in between the writing of the test content to the selected group of cells and the reading of the selected group of cells.

21. The device according to claim 20, wherein the measurement circuit further operates, for at least one selected group of cells, to backup the content of the selected group of cells and restore the content of the selected group of cells with the backed up content following metering of the number of content errors.

22. The device according to claim 20, further comprising:
a first and a second buffer memory connected to the dynamic random access memory;
wherein the write circuit writes the test content into the first buffer memory before writing to the selected group of cells, and wherein the read circuit writes the read content of the selected group of cells into the second buffer memory followed by reading the second buffer memory.

23. The device according to claim 21, wherein the measurement circuit performs the backup in a predetermined part of the memory or else in an external backup memory.

24. The device according to claim 22, wherein each selected group of cells forms a single page of the memory, and backing is made to one of the first and second buffer memories.

25. The device according to claim 20, wherein the memory refreshing circuit comprises:
a comparison circuit to compare the metered number of accumulated errors with a low threshold and a high threshold; and
a regulating circuit that increases the refresh period if the metered number of errors is less than the low threshold, decreases the refresh period if the metered number of errors is greater than the high threshold, and leaves the refresh period unchanged if the metered number of errors is greater than or equal to the low threshold and less than or equal to the high threshold.

26. The device according to claim 20, wherein the memory refreshing circuit comprises:
a comparison circuit to compare the metered number of accumulated errors with a threshold; and
a regulating circuit to increase the refresh period if the metered number of errors is less than the threshold and decrease the refresh period if the metered number of errors is greater than or equal to the threshold.

27. The device according to claim 26, further comprising storage means for storing a minimum limit value and a maximum limit value for the refresh period.

28. A process for dynamically adjusting the refresh rate of a dynamic random access memory array, comprising:
selecting a group of memory cells within the memory, the selected group of memory cells comprising a sub-set of the entire memory array;
measuring a test data content retention time for the selected group of memory cells at a measurement rate which exceeds a current refresh rate of the dynamic random access memory array;
in the meantime, continuing to refresh the non-selected memory cells within the memory at the current refresh rate; and
adjusting the current refresh rate based on the measured test data content retention time.

29. The process according to claim 28, further comprising repeating the steps of claim 28 and selecting a different group of memory cells with each repeat so as to scan all of the cells of the memory.

30. The process according to claim 29, wherein adjusting comprises making an adjustment to the current refresh rate based on the measured test data content retention times for all groups of memory cells.

31. The process according to claim 28, wherein the measurement rate is selected in comparison to the current refresh rate so as to refresh the non-selected memory cells at least twice before a test data content retention time measurement is made.

32. The process according to claim 28, wherein measuring comprises:
writing test data to the selected group of memory cells;
reading the test data from the selected group of memory cells after expiration of a delay set by the measurement rate;
counting a number of content errors in the read test data.

33. The process according to claim 32, wherein adjusting comprises:
comparing the number of content errors to a threshold;
decreasing the current refresh rate if the number is less than the threshold; and
increasing the current refresh rate if the number more than the threshold.

34. The process according to claim 32, further comprising repeating the steps of claim 30 and selecting a different group of memory cells with each repeat so as to scan all of the cells of the memory, and wherein counting comprises accumulating the number of content errors with each repeat.

35. The process according to claim 34, wherein adjusting comprises:
comparing the accumulated number of content errors to a threshold;
decreasing the current refresh rate if the accumulated number is less than the threshold; and
increasing the current refresh rate if the accumulated number more than the threshold.

36. A process for selectively adjusting refresh rate of a dynamic random access memory array, comprising:
successively selecting groups of memory cells within the memory, each selected group of memory cells comprising a sub-set of the entire memory array;
measuring a test data content retention time for each selected group of memory cells;
in the meantime, continuing to refresh the non-selected memory cells in accordance with their refresh rate;
tagging certain ones of the selected groups of cells having a lower test data retention time; and
adjusting the refresh rate for the memory cells such that tagged selected groups of memory cells are refreshed more frequently than non-tagged selected groups of memory cells.

37. The process according to claim 36, wherein measuring comprises:
writing test data to the selected group of memory cells;
reading the test data from the selected group of memory cells after expiration of a delay;
counting a number of content errors in the read test data.

38. The process according to claim 37, wherein tagging identifies certain ones of the selected groups of cells whose number of content errors exceeds a threshold.

39. The process according to claim 36, further comprising regulating the refresh rate for non-tagged selected groups of memory cells based on the measured test data content retention times for all selected group of cells.

40. The process according to claim 39, wherein regulating comprises:
 writing test data to each selected group of memory cells;
 reading the test data from each selected group of memory cells after expiration of a delay;
 accumulating a number of content errors in the read test data;
 comparing the accumulated number of content errors to a threshold;
 decreasing the refresh rate for non-tagged selected groups of memory cells if the accumulated number is less than the threshold; and
 increasing the refresh rate for non-tagged selected groups of memory cells if the accumulated number more than the threshold.

* * * * *

UNITED STATES PATENT AND TRADEMARK OFFICE
CERTIFICATE OF CORRECTION

| | | |
|---|---|---|
| PATENT NO. | : 7,193,918 B2 | |
| APPLICATION NO. | : 10/766291 | |
| DATED | : March 20, 2007 | |
| INVENTOR(S) | : Michel Harrand et al. | |

It is certified that error appears in the above-identified patent and that said Letters Patent is hereby corrected as shown below:

In the Specification:

At column 8, line number 6, please replace [32 ins.] with -- 32 ms --.

At column 9, line number 56, please replace [50] with -- so --.

Signed and Sealed this
Thirteenth Day of September, 2011

David J. Kappos
*Director of the United States Patent and Trademark Office*